(12) United States Patent
Iannone et al.

(10) Patent No.: US 7,567,377 B2
(45) Date of Patent: Jul. 28, 2009

(54) MULTIBAND AMPLIFIER BASED ON DISCRETE SOA-RAMAN AMPLIFIERS

(75) Inventors: Patrick P. Iannone, Red Bank, NJ (US); Kenneth C. Reichmann, Hamilton, NJ (US); Xiang Zhou, Middletown, NJ (US)

(73) Assignee: AT&T Corp., New York, NY (US)

( * ) Notice: Subject to any disclaimer, the term of this patent is extended or adjusted under 35 U.S.C. 154(b) by 0 days.

(21) Appl. No.: 11/701,077

(22) Filed: Feb. 1, 2007

(65) Prior Publication Data

US 2007/0183023 A1 Aug. 9, 2007

Related U.S. Application Data

(63) Continuation-in-part of application No. 11/412,645, filed on Apr. 27, 2006, now Pat. No. 7,443,575.

(60) Provisional application No. 60/765,149, filed on Feb. 3, 2006.

(51) Int. Cl.
*H01S 4/00* (2006.01)
(52) U.S. Cl. .................. 359/334; 359/337.4; 359/344
(58) Field of Classification Search ................ 359/334, 359/337.4, 344
See application file for complete search history.

(56) References Cited

U.S. PATENT DOCUMENTS

| | | | | |
|---|---|---|---|---|
| 6,657,777 | B1 * | 12/2003 | Meli et al. | 359/334 |
| 6,657,780 | B2 * | 12/2003 | Choa | 359/349 |
| 7,126,747 | B2 * | 10/2006 | Lee | 359/334 |
| 7,224,863 | B1 * | 5/2007 | Li et al. | 385/27 |
| 7,342,714 | B2 * | 3/2008 | Iannone et al. | 359/349 |
| 2004/0057735 | A1 * | 3/2004 | Uesaka | 398/201 |
| 2005/0129412 | A1 * | 6/2005 | Centanni et al. | 398/183 |
| 2005/0226635 | A1 * | 10/2005 | Ionov et al. | 398/161 |
| 2006/0126159 | A1 * | 6/2006 | Chung et al. | 359/334 |
| 2006/0291037 | A1 * | 12/2006 | Iannone et al. | 359/334 |
| 2007/0230960 | A1 * | 10/2007 | Iannone et al. | 398/79 |
| 2007/0230968 | A1 * | 10/2007 | Shimizu | 398/177 |

OTHER PUBLICATIONS

ITU Recommendation G.694.2, Spectral Grids for WDM Applications: CWDM Wavelength Grid (Jun. 2002).

H. J. Thiele, L. Nelson, J. Thomas, B. Eichenbaum, L. Spiekman, and G. van den Hoven, "Linear optical amplifier for extended reach in CWDM transmission systems," OFC 2003, Atlanta, GA, paper MF21, Mar. 2003.

Y. Chen, R. Pavlik, C. Visone, F. Pan, E. Gonzales, A. Turukhin, L. Lunardi, D. Al-Salameh, and S. Lumish, "40 nm Broadband SOA-Raman Hybrid Amplifier," OFC 2002, Anaheim, CA, paper ThB7, Mar. 2002.

T. Miyamoto, T. Tsuzaki, T. Okuno, M. Kakai, M. Hirano, M. Onishi, M. Shigematsu, and M. Nishimura, "Highly-Nonlinear-Fiber-Based Discrete Raman Amplifier for CWDM Transmission Systems," OFC 2003, Atlanta, GA, paper MF19, Mar. 2003.

(Continued)

*Primary Examiner*—Eric Bolda (57) ABSTRACT

Several discrete hybrid amplifiers are used in parallel for amplifying an optical signal in an optical fiber system. An optical signal is first split into two or more separate signals each with a separate wavelength band. Each wavelength band is then amplified by a Raman pump utilizing a length of highly non-linear fiber as the gain medium, and by an SOA amplifier. The combination of the Raman amplifier and the SOA yields a level gain over the wavelength band. The amplified wavelength band signals are then recombined. The disclosed amplifier is especially useful in coarse wavelength division multiplexing (CWDM) systems and in local access portions of the network.

18 Claims, 5 Drawing Sheets

OTHER PUBLICATIONS

L. H. Spiekman et al, "8×10 Gb/s DWDM Transmission over 240 km of Standard Fiber Using a Cascade of Semiconductor Optical Amplifiers," IEEE Photon Tech. Lett., vol. 12, pp. 1082-1084, 2000.

P. Iannone, K. Reichmann, X. Zhou and N. Frigo, "200 km CWDM Transmission Using a Hybrid Amplifier," paper OThG3, OFC Mar. 2005.

* cited by examiner

MULTIBAND AMPLIFIER BASED ON DISCRETE SOA-RAMAN AMPLIFIERS

CLAIM OF PRIORITY

This application is a continuation-in-part of U.S. patent application Ser. No. 11/412,645, filed Apr. 27, 2006, now U.S. Pat. No. 7,443,575 and entitled "Discrete Hybrid SOA-Raman Amplifier with Broad Gain Bandwidth," and claims priority to U.S. Provisional Patent Application Ser. No. 60/765,149, filed Feb. 3, 2006, and entitled "Multi-Band Amplifier Based on Discrete SOA-Raman Amplifiers."

FIELD OF THE INVENTION

The present invention relates generally to transporting optical signals on an optical fiber over moderate distances. More particularly, the present application relates to the use of discrete hybrid amplifiers, including a semiconductor optical amplifier and Raman amplifier components, to amplify a signal having a wavelength range larger than the effective range of the individual discrete hybrid amplifiers.

BACKGROUND OF THE INVENTION

Although low-loss optical fiber, reliable laser transmitters and low-noise optical receivers have been commercially deployed in fiber optic transmission systems since the early 1980s, it was not until the deployment of reliable commercial optical amplifiers in the early 1990s that the high capacity and low cost-per-bit of wavelength-division multiplexed (WDM) transmission systems could be realized. The introduction of the erbium-doped fiber amplifier (EDFA) revolutionized optical communications by simultaneously amplifying a multiplicity of WDM channels. A single N-channel EDFA replaced N costly regenerators, each composed of an optical-to-electrical converter, a re-timing circuit, a decision circuit, an electronic amplification circuit, and a laser transmitter.

Surprisingly, more than 10 years after its commercial introduction, the EDFA remains the only broadly deployed optical amplifier technology. This, despite the fact that the EDFA has a limited optical bandwidth (under 40 nm) and generally operates only in the C-band (1530-1560-nm wavelength). Although more versatile amplifiers have been demonstrated in the lab, such as semiconductor optical amplifiers (SOA) and Raman amplifiers, those technologies have not gained commercial acceptance due to their inability to compete with the low cost and high performance of EDFAs.

Semiconductor optical amplifiers (SOA) are based on the same mature processing technology as commercial semiconductor lasers. They are far more compact than EDFAs, have the potential for significant cost advantages relative to EDFAs, and have long been considered a natural candidate for use as line amplifiers in WDM transmission systems. Demonstrations of SOA-based amplified transmission systems predate the invention of the EDFA. SOAs, however, have failed to gain acceptance as a viable WDM amplifier for several reasons, including:

1) Commercial EDFAs can be produced with higher gains and higher output powers than can SOAs.

2) Producing amplifiers with low polarization-dependent gain (PDG) is more challenging for SOAs than for EDFAs.

3) Due to the differences in carrier lifetimes in the two gain media, SOAs are susceptible to inter-channel gain-saturation-induced crosstalk, while EDFAs are largely immune to that adverse effect.

4) SOAs suffer from pronounced gain variations across optical bandwidths typical of WDM systems, while EDFA technology is amenable to the production of multi-stage amplifiers which can incorporate gain-flattening filters and other devices to improve amplifier performance without adversely affecting the amplifier noise figure.

Over the past several years that situation has begun to turn around. Processing improvements have resulted in SOAs with higher gains, higher output powers, and lower PDG. Although modern EDFAs still outperform the latest generation of SOAs, network designers are reconsidering SOAs as the demand for optical networking solutions has increasingly moved from the highly aggregated core network (where performance considerations outweigh cost issues) to the edge of the network (where high performance is often a lower priority than cost and flexibility).

Just as SOA technology was evolving with an eye toward reducing the cost of longer-reach dense wavelength-division multiplexed (DWDM) offerings for this cost-sensitive new market, coarse wavelength division multiplexing (CWDM)—an entirely new un-amplified WDM standard—arose as a low-cost short-reach solution. With optical channel spacings 25-50 times those of standard DWDM, CWDM trades off reach and capacity for cost. CWDM is presently considered an un-amplified technology due to the unavailability of amplifiers that can operate over the wide optical band of a typical system (1470-1610 nm for an 8-channel system). SOAs, which can be engineered to operate at any wavelength within the 1300-1650 nm low-loss region of optical fiber, and typically have a broader band of operation than EDFAs, have been proposed as amplifiers capable of both extending the reach of CWDM systems and reducing the cost of metro DWDM systems (while increasing their flexibility). In the case of CWDM, the SOA gain bandwidth is sufficient to amplify 4 CWDM channels simultaneously. Unfortunately, the best of today's commercially available SOAs still exhibit significant gain variations across that operating band, rendering them unsuitable for most practical CWDM (and DWDM) applications.

The inventors have demonstrated that by combining an SOA with a moderate-gain distributed Raman amplifier, the SOA gain variation can be significantly reduced, the net optical bandwidth can be increased, and the net gain can be increased. Because the Raman gain spectrum in silica fiber has a "ramp" shape, increasing with wavelength until it peaks at roughly 100 nm to the long-wavelength side of the Raman pump wavelength, it is well suited to compensating the monotonic decrease in gain to the long-wavelength side of the SOA gain peak. The SOA provides the bulk of the gain while the Raman gain provides gain tilt compensation. That configuration has an additional benefit in that the information-bearing signals may be positioned to the long-wavelength side of the SOA gain peak (where saturated output powers are highest), resulting in reduced cross-gain modulation in the SOA. The distributed hybrid amplifier 100, shown schematically in FIG. 1, consists of an SOA 140, a Raman pump laser 120, a pump coupler 130, an optical isolator 150, and a long length of single-mode optical fiber 110 that serves as both the transmission fiber and the Raman gain medium.

Figure 1:
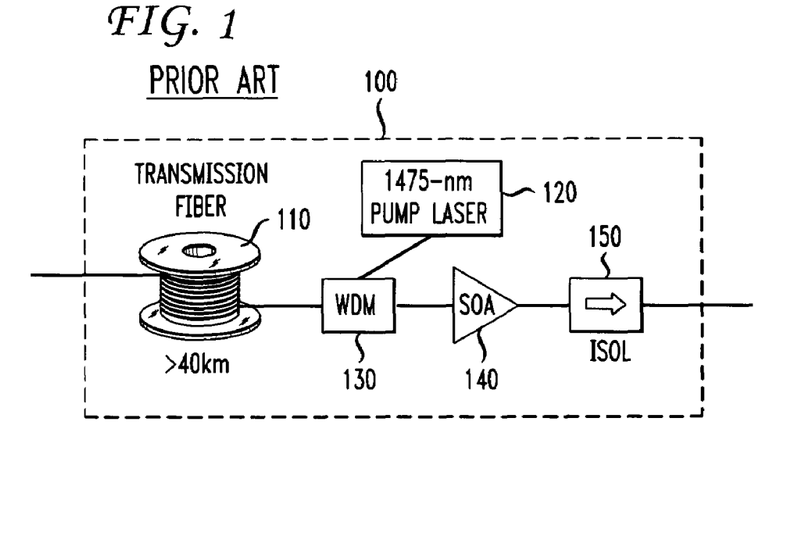
FIG. 1 is a schematic representation of a prior art hybrid amplifier.
Figure 2:
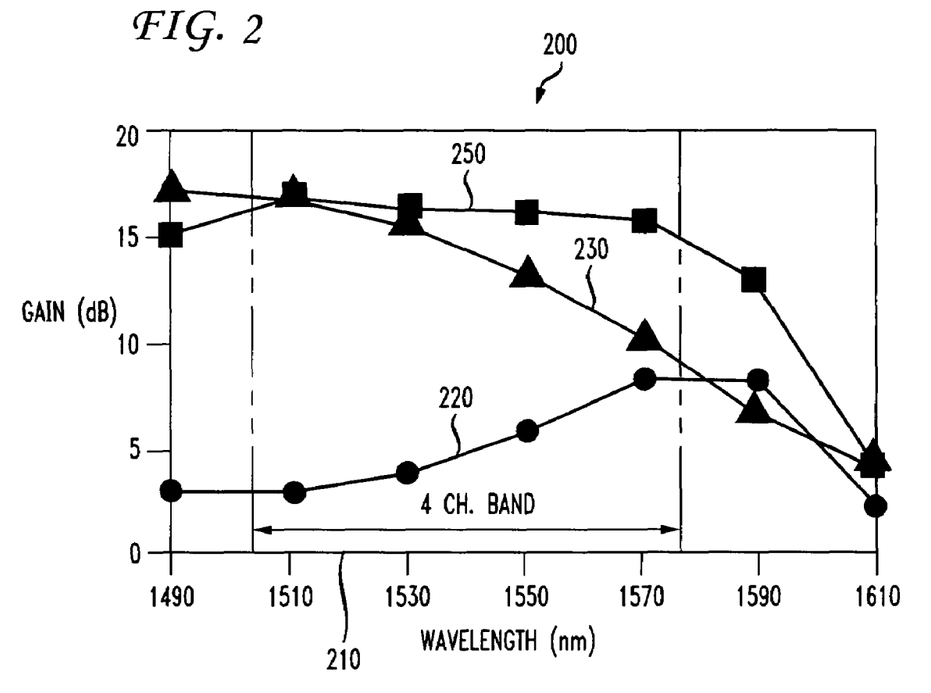
FIG. 2 is a gain versus wavelength plot representing several components of the amplifier of FIG. 1.

The amplifier 100 is said to be a "distributed" amplifier because the Raman gain is distributed along the length of the transmission fiber 110. In FIG. 2 is shown a plot 200 of the gain vs. wavelength of the hybrid amplifier and its constituent stages. The triangles 230 represent operation of the SOA alone and show a gain tilt of 6.6 dB over a CWDM 4-channel band 210 between 1510 nm and 1570 nm. The circles 220 represent the Raman gain (increasing by 5.7 dB from 1510 to 1570 nm) achieved by counter-propagating a commercial tunable fiber Raman laser supplying 300 mW of pump power at 1475 nm wavelength through 80 km of reduced water peak standard single mode fiber. That pump wavelength was chosen to produce a Raman gain spectrum which peaks at approximately 1575 nm. The hybrid combination, represented by the squares 250, shows the compensated SOA gain tilt with nearly flat response (0.9 dB variation) over the four CWDM channels with a minimum gain of 16.1 dB. The Raman pump power was intentionally limited to 300 mW to stay within the range of readily available and relatively inexpensive commercial semiconductor Raman pumps.

The data in FIG. 2 represents one instantiation of the above-described distributed amplifier design. With proper choice of SOA and Raman pump wavelength, similar results could have been demonstrated over any band within the wavelength range 1300-1650 nm.

There have been several recent demonstrations of "discrete" optical amplifiers that display wider optical bandwidth, but at a substantial increase in cost. A "discrete" optical amplifier, as opposed to a "distributed" optical amplifier, does not utilize the transmission fiber for amplification. Those broadband amplifier demonstrations have taken advantage of doped fiber amplification (the physical mechanism behind the EDFA) and discrete Raman amplification (using a shorter section of dedicated, highly non-linear fiber (HNLF)).

As mentioned previously, erbium-doped fiber amplifiers (EDFA) are nearly ideal for optical communication applications, due to their maturity, low multi-channel crosstalk, high gain, high output powers, and gain flatness. Unfortunately, commonly available C-band EDFAs cover less than two CWDM channels, and do not have the versatility to operate over any band within the low-loss window of optical fiber.

For example, a new hybrid doped-fiber amplifier is described in T. Sakamoto et al., "Rare-Earth-Doped Fiber Amplifier for Eight-Channel CWDM Transmission Systems," Optical Fiber Communication Conference and Exhibit 2004, Los Angeles, Calif., paper ThJ5 (March 2004). That amplifier combines three doped fiber amplifier technologies in two branches. One branch consists of an EDFA in series with a thulium-doped fiber amplifier (TDFA). A second, parallel branch consists of an erbium-doped tellurite fiber amplifier (EDTFA). That arrangement promises impressive performance with relatively flat gain of 22.5 dB over the conventional 8-channel CWDM band from 1463 nm to 1617 nm, but is complex, has a high component count, and relies on immature technology, all of which contribute to a high cost for this approach.

Discrete Raman amplification, which can be tailored to a particular wavelength region and gain bandwidth by judicious choice of pump wavelengths and powers, has been demonstrated over the conventional 8 channel CWDM band by the authors of T. Miyamoto et al., "Highly-Nonlinear-Fiber-Based Discrete Raman Amplifier for CWDM Transmission Systems," Optical Fiber Comm. Conf. and Exhibit 2003, Atlanta, Ga., paper MF19 (March 2003). Their design, using HNLF to increase conversion efficiency, employed six pump lasers with various wavelengths and powers. One, at 1360 nm, was used in both the forward and reverse directions with powers of 211 mW and 614 mW, respectively. Diode laser pumps with output powers above 500 mW are not only more costly than lower power pumps, but are considered Class IV lasers and therefore require more stringent (and costly) laser safety procedures of both vendors and network operators. The remaining pumps had more moderate powers ranging from 236 mW to 7 mW. That design, while simpler than the rare earth doped fiber amplifier mentioned previously, has a lower net gain of approximately 10 dB and is still considered too complex and costly for metro and access applications.

As noted above, CWDM's low cost relative to dense wavelength division multiplexing (DWDM) is attributed to the fact that the CWDM spectrum is orders of magnitude sparser than a typical DWDM spectrum. The ITU standard for CWDM defines a maximum of 18 wavelength channels with a channel-to-channel wavelength separation of 20 nm. That large channel spacing permits approximately a 13-nm channel bandwidth, which in turn makes possible the use of inexpensive CWDM optics and directly modulated, un-cooled semiconductor laser transmitters. As presently implemented, CWDM must be considered an un-amplified technology since the large wavelength spread occupied by all channels in a typical commercial CWDM system (for example, 153 nm for an 8-channel system) cannot be accommodated by readily available low cost optical amplifiers. That constraint limits the reach of most existing CWDM systems to about 80 km.

There therefore remains a need for a low-cost, broadband optical amplifier to overcome those reach limits of commercial CWDM systems. Such an amplifier would also open up new wavelength bands to existing DWDM techniques.

SUMMARY OF THE INVENTION

The present invention addresses the needs described above by providing a method and system for amplifying an optical signal in an optical fiber. One embodiment is an amplifier system for amplifying a data-bearing optical signal. The amplifying system includes a signal separator for separating the data-bearing optical signal into a plurality of wavelength bands, the separator having an input for receiving the data-bearing signal and a plurality of separator outputs, each for transmitting one of the wavelength bands. The amplifier further includes a plurality of discrete hybrid optical amplifiers, the amplifiers being connected in one-to-one correspondence to the separator outputs, each amplifier comprising a discrete Raman amplifier including an optical highly non-linear fiber (HNLF) and a backward-propagating Raman pump laser, and a semiconductor optical amplifier (SOA) coupled in series with the discrete Raman amplifier. The amplifier additionally includes a signal recombiner for recombining amplified wavelength bands from the discrete, hybrid optical amplifiers to form an amplified data-bearing signal, the signal recombiner having an output for transmitting the amplified data-bearing signal.

The data-bearing optical signal may comprise eight coarse wavelength division multiplexed (CWDM) channels, and the plurality of wavelength bands may include two bands of four CWDM channels each. The signal separator may be an optical band demultiplexer and the signal recombiner is an optical band multiplexer. The Raman pump laser in each discrete, hybrid optical amplifier may have a pumping wavelength below the wavelength band of the connected separator output.

A gain of the discrete Raman amplifier of each discrete hybrid optical amplifier may increase within the wavelength band of the connected separator output, and a gain of the SOA in that amplifier may decrease within that wavelength band. In that case, a sum of the gains of the discrete Raman amplifier and the SOA in each discrete hybrid optical amplifier may be more constant over the wavelength range than the individual gains.

The HNLF may be less than 5 kilometers in length, or may be 3 kilometers or less in length. Each discrete, hybrid optical amplifier may further comprise an optical isolator coupled to an output of the SOA.

Another embodiment of the invention is a method for amplifying a data-bearing optical signal. The method includes the steps of separating the optical signal into a plurality of wavelength band signals, each wavelength band signals being within a different wavelength band; transmitting each the wavelength band signal in a forward direction through a separate optical highly non-linear fiber (HNLF); introducing a separate backward-propagating Raman pumping signal into each separate HNLF to amplify the wavelength band signal; further amplifying each the wavelength band signal using a separate semiconductor optical amplifier (SOA) for each wavelength band signal; and recombining the plurality of wavelength band signals after amplification by the SOA and Raman pumping signal to form a recombined amplified data-bearing optical signal.

The step of introducing a separate backward-propagating Raman pumping signal into each separate HNLF may further comprise introducing a Raman pumping signal having a pumping wavelength below the wavelength band of the signal transmitted through that HNLF.

A gain of the Raman pumping signal may increase within the wavelength band of the corresponding transmitted signal, while the gain of the SOA decreases within that wavelength band. In that case, a sum of gains of a Raman pump and corresponding SOA may be more constant over a corresponding wavelength band than the individual gains.

The sum of the gains of a Raman pump and corresponding SOA may have broader bandwidth than the individual gains.

The method may further comprise the step of transmitting an output of each SOA through a separate optical isolator.

The step of separating the optical signal into a plurality of wavelength band signals, each wavelength band signals within a different wavelength band, may further comprise separating an optical signal containing eight CWDM channels into two wavelength band signals each containing four CWDM channels.

Another embodiment of the invention is an amplifier system for amplifying data-bearing optical signals in a bidirectional optical transport system. The amplifier system comprises a first signal separator/recombiner for connecting a first bidirectional path segment with a first unidirectional path for transmitting an optical signal in a first direction and a second unidirectional path for transmitting an optical signal in a second direction. The bidirectional amplifier system additionally includes a first discrete, hybrid optical amplifier in the first unidirectional path, comprising a first discrete Raman amplifier including an optical highly non-linear fiber (HNLF) and a backward-propagating Raman pump laser; and a first semiconductor optical amplifier (SOA) coupled in series with the first discrete Raman amplifier. The amplifier system further includes a second discrete, hybrid optical amplifier in the second unidirectional path, comprising a second discrete Raman amplifier including an optical highly non-linear fiber (HNLF) and a backward-propagating Raman pump laser; and a second semiconductor optical amplifier (SOA) coupled in series with the second discrete Raman amplifier. The amplifier system also comprises a second signal separator/recombiner for connecting a second bidirectional path segment with the first unidirectional path and the second unidirectional path.

The first and second signal separator/recombiners may be optical band multiplexer/demultiplexers, or may alternatively be optical circulators. The optical signal transmitted in the first direction may comprise four coarse wavelength division multiplexed (CWDM) channels, and the optical signal transmitted in the second direction may comprise four coarse wavelength division multiplexed (CWDM) channels.

The bidirectional amplifier system may further comprise a first optical isolator coupled to an output of the first SOA, and a second optical isolator coupled to an output of the second SOA.

DESCRIPTION OF THE INVENTION

The inventors have developed a low cost discrete hybrid SOA-Raman amplifier capable of simultaneously amplifying multiple WDM channels over a broad optical band (up to ~80 nm) with a center wavelength that can be specified (with the proper choice of Raman pump wavelength and SOA) over the entire low-loss band in optical fiber (~1300-1600 nm). The commercial availability of such an amplifier could open the door to far more flexible and efficient optical networks, particularly in the metro and access portions of the network where flexibility and low cost are paramount.

A potential drawback of the distributed hybrid amplifier described above is the fact that the Raman gain occurs along the transmission fiber. To that point, service providers have been reluctant to deploy distributed Raman amplifiers for several reasons:

1) The overall Raman gain is dependent on the type, batch, and manufacturer of the transmission fiber as well as any additional losses or reflections in the transmission span due to micro-bends, splices or connectors. Should a particular span have high discrete losses or reflections (particularly over the last few kilometers of the span, where the backward propagating pump light is most intense), the trouble spots would have to be isolated and repaired (thus increasing the cost of the installation).

2) The introduction of relatively high-power Raman pump signals into the transmission fiber increases the cost associated with meeting eye-safety standards and practices.

The costs and performance variations associated with distributed Raman amplification can be avoided in a discrete Raman amplifier, in which the Raman gain medium is a separate length of HNLF. Thus, the entire Raman amplifier is a discrete "black box" containing the HNLF, pump coupler, pump laser, and isolator, with well-specified performance independent of the transmission fiber.

The inventors have developed a discrete hybrid SOA-Raman amplifier, having some characteristics of the hybrid amplifier described above, and utilizing as a Raman gain medium a relatively short length of HNLF rather than the long length of transmission fiber. A proposed discrete hybrid amplifier 300 is shown schematically in FIG. 3. The amplifier 300 includes a highly non-linear fiber 310 and a Raman pump laser 340 coupled to the HNLF through a wavelength-selective coupler 330 (or broadband optical circulator). The hybrid amplifier further includes an SOA 344 and an optical isolator 352.

Figure 3:
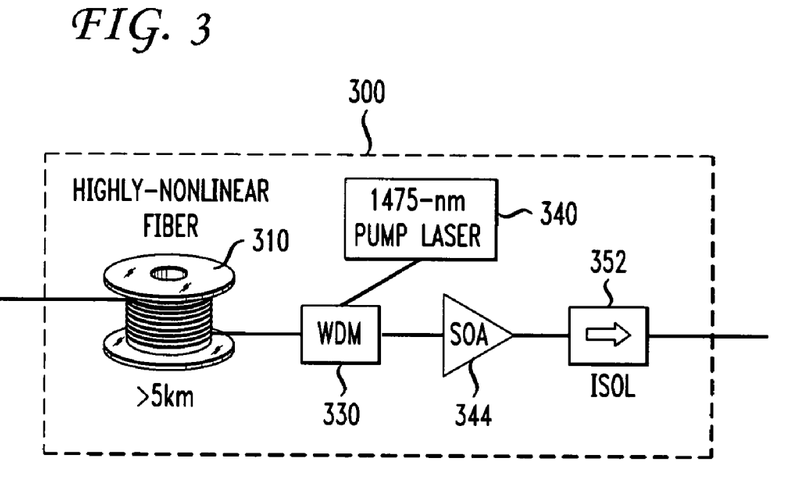
FIG. 3 is a schematic representation of a hybrid amplifier according to one embodiment of the invention.

The highly nonlinear fiber 310 is characterized by a nonlinear index of refraction that is large in comparison to that in conventional transmission fibers, and can be realized in several different forms including solid-core fibers and so-called microstructure fibers, also known as holey fibers or photonic crystal fibers. The fibers may further be dispersion-compensating fibers. The HNLF is under 10 kilometers in length and may be under 5 kilometers. The inventors have conducted successful experiments with an HNLF approximately 3 kilometers in length. Shorter fibers will permit more compact designs. The use of holey fiber or microstructure fiber as the HNLF would result in a further significant decrease in the length of the HNLF.

Figure 4:
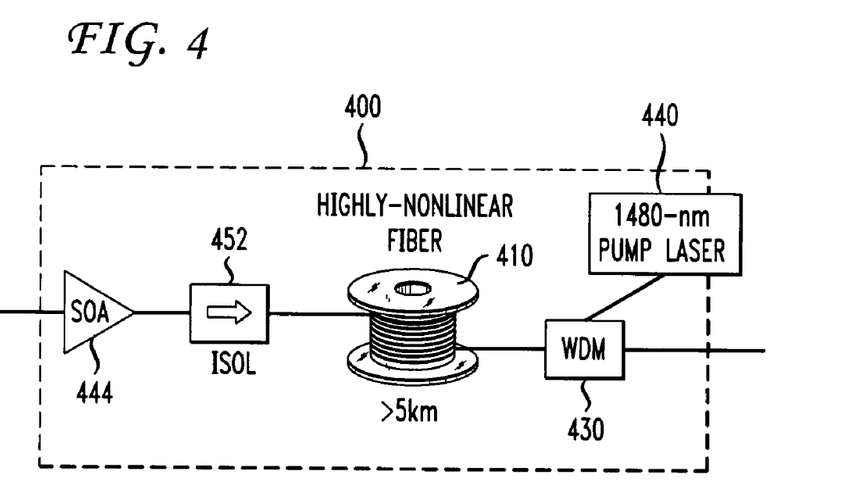
FIG. 4 is a schematic representation of a hybrid amplifier according to another embodiment of the invention.

As shown by the hybrid amplifier 400 of FIG. 4, the ordering of the Raman gain stage (HNLF 410, pump coupler 430, and pump laser 440) and the SOA stage (SOA 444 and isolator 452) may be reversed without adversely affecting the gain of the hybrid amplifier. Whether to choose the order shown in FIG. 3. or the reverse order shown in FIG. 4 depends on the noise and power handling properties of the two stages.

The more conventional doped-core HNLF fibers with relatively large index of refraction change between the core and cladding ($\Delta n$) typically have nonlinear coefficients that exceed those in standard transmission fibers by an order of magnitude or more. For example, an HNLF may have nonlinear coefficients $10\ W^{-1}\ km^{-1} \leq \gamma \leq 21\ W^{-1}\ km^{-1}$, as compared to $\gamma=1.3\ W^{-1}\ km^{-1}$ for standard single-mode fiber. Microstructure fibers have recently been demonstrated with $\gamma$ exceeding that in standard fiber by a factor of 1000 or more; however, that technology is immature and may require several years before commercialization.

The presently-described discrete amplifier design has the advantage of broadband operation (up to ~80 nm) over any part of the low-loss window in an optical fiber (1300 nm-1650 nm). Since the bulk of the gain is derived from an inexpensive SOA, with the Raman gain primarily providing gain-tilt compensation, the overall amplifier subsystem is relatively inexpensive.

Figure 5:
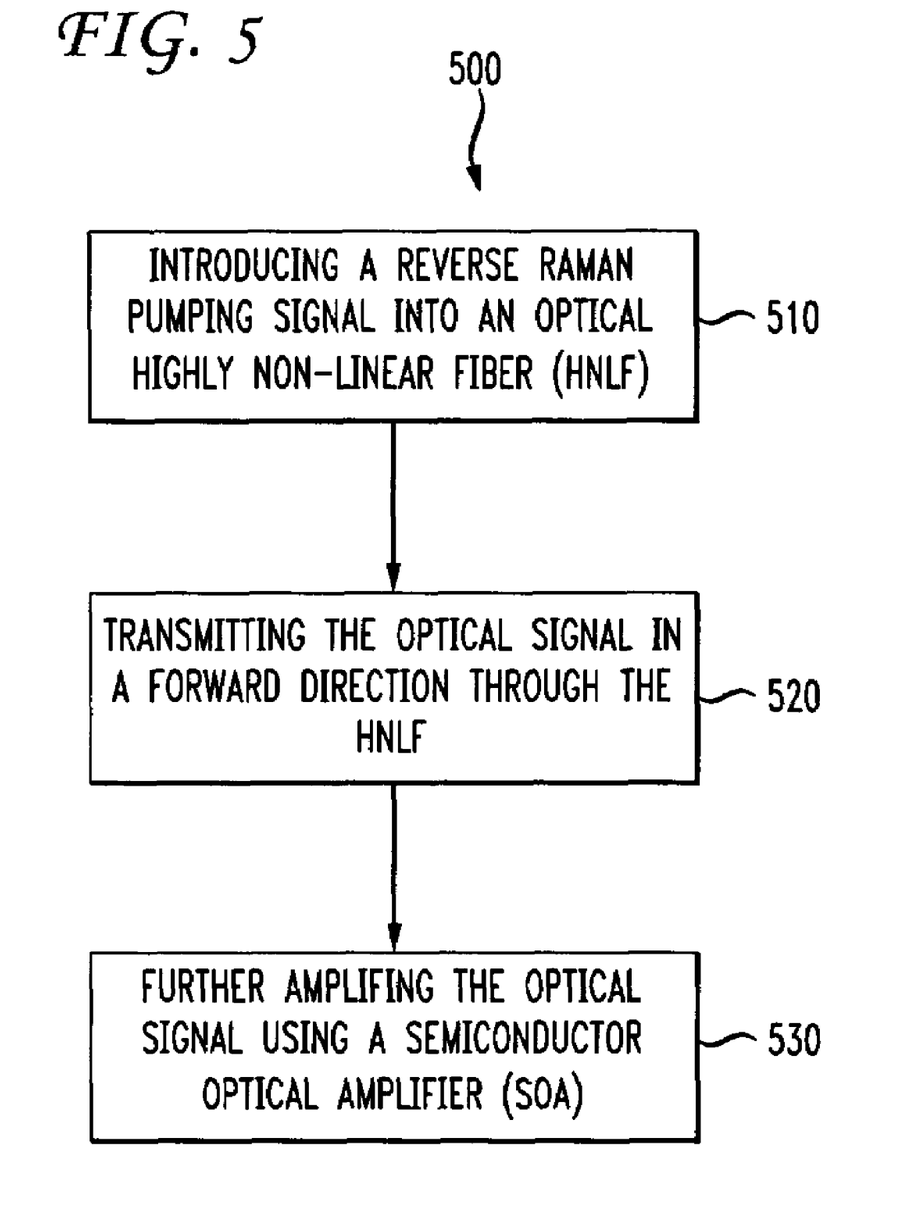
FIG. 5 is a flow chart showing a method according to one embodiment of the invention.

The invention described herein further contemplates a method 500, shown in FIG. 5, for amplifying an optical signal within a wavelength range including at least one optical wavelength signal channel. The method comprises the steps of introducing (step 510) a reverse Raman pumping signal into an optical highly non-linear fiber (HNLF), transmitting (step 520) the optical signal in a forward direction through the HNLF, and further amplifying (step 530) the optical signal using a semiconductor optical amplifier (SOA).

The above described invention provides a flexible, relatively high-performance discrete hybrid SOA-Raman amplifier suitable for commercialization in the cost-sensitive metro-area and local-access portions of the network. The amplifier has performance similar to a distributed hybrid SOA-Raman amplifier, but its discrete implementation will eliminate potential performance degradations caused by non-idealities in the transmission fiber as well as concerns related to eye safety.

In FIG. 3 above, a backward propagating Raman pump laser is coupled through a WDM coupler, to a relatively short length of highly-nonlinear fiber (HNLF). The HNLF is preferably less than 5 km long, and is more preferably about 3 km. The HNLF is followed by a conventional polarization-independent SOA and an optical isolator. The Raman pump wavelength in that embodiment is chosen to compliment the SOA such that the combined gain of the discrete hybrid amplifier is both increased and flattened as compared to the SOA alone. In the embodiment shown in FIG. 4 above, the same components are rearranged with the SOA as the first stage followed by the discrete Raman amplifier. Choosing between those two implementations depends on the performance of each stage.

Figure 6:
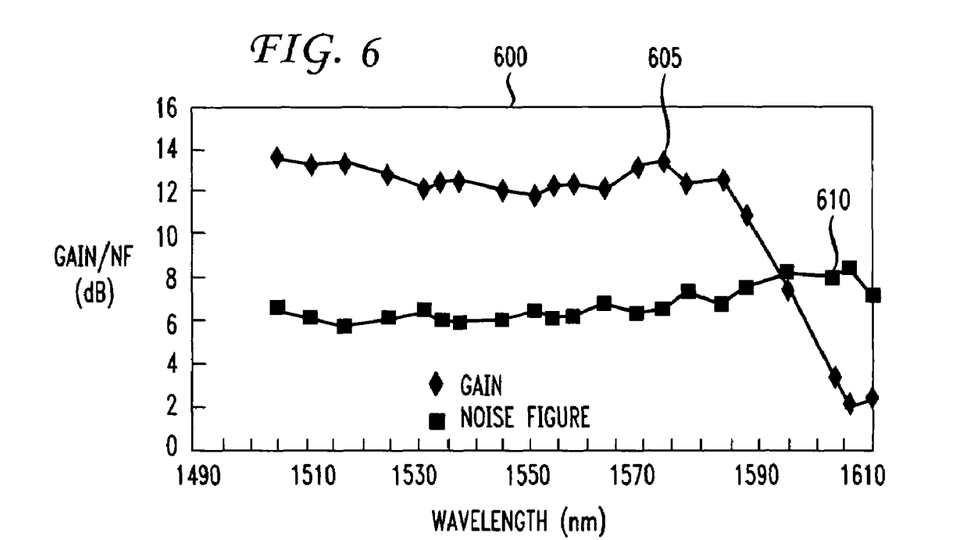
FIG. 6 is a plot of measured amplifier gain and noise figure versus wavelength for a discrete hybrid SOA-Raman amplifier.

For example, the chart 600 of FIG. 6 shows the measured gain 605 and noise FIG. 610 for an implementation similar to that shown in FIG. 4. An SOA-first arrangement was chosen because the available HNLF exhibited excess loss and thus would have degraded the noise figure in a Raman-first configuration. In the example case, the Raman pump laser operated at 1475-nm wavelength with 310-mW coupled into the HNLF, and the SOA gain peak was approximately 1510-nm wavelength. The HNLF used for the demonstration was a 3-km length of solid-core fiber. Other types of HNLF could also be employed such as photonic crystal fiber or holey fiber. Naturally, with the proper choice of Raman pump wavelength and SOA gain peak, the same arrangement could be implemented to cover any contiguous four-channel band within the 18-channel CWDM spectrum; however, different pump powers may be required at shorter wavelengths due to the wavelength dependence of the fiber loss and the Raman gain coefficient.

The following describes a new multi-band amplifier that has been developed by the inventors based on the discrete hybrid SOA-Raman amplifiers described above. The multiband amplifier is capable of amplifying all eight CWDM channels typically used in today's commercial CWDM systems. The unique design of that amplifier not only facilitates simultaneous amplification of the eight-channel band, but makes possible relatively long distance transmission via a multi-amplifier cascade. The use of discrete Raman amplification, rather than distributed Raman amplification, has important practical implications as noted above. A variation of the design is also described for use in a single-fiber bidirectional system, with one discrete amplifier dedicated to downstream (east-bound) and one dedicated to upstream (west-bound) transmission.

Although the optical bandwidths of the SOA and Raman gain are naturally well suited to a four-channel hybrid amplifier design, most commercial CWDM systems employ eight CWDM channels from 1470 nm to 1610 nm. The inventors have developed novel two-band variations of the discrete hybrid SOA-Raman amplifier described above, capable of amplifying the entire commonly-used 8 channel band. Since the discrete hybrid SOA-Raman amplifier subsystem can be thought of as a completely enclosed "black box," the repeatability and safety concerns typical of distributed amplifiers are avoided.

Figure 7:
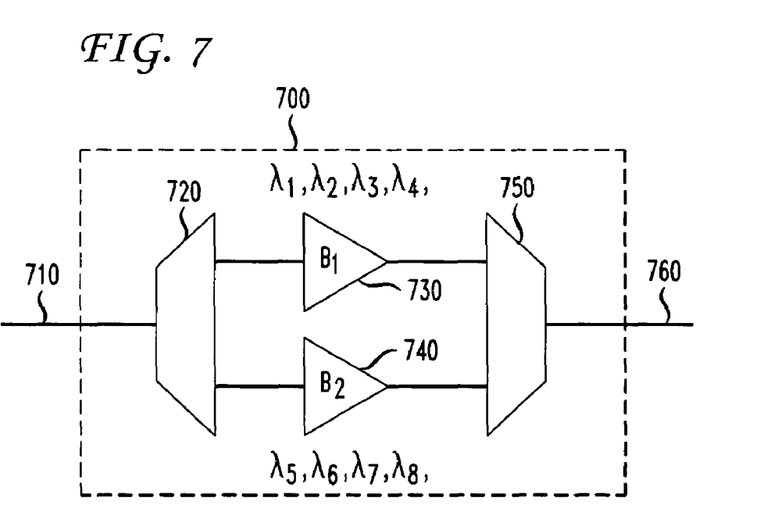
FIG. 7 is a schematic representation of a two-band discrete hybrid SOA-Raman amplifier according to one embodiment of the invention.

FIG. 7 shows a schematic representation of a two-band amplifier 700 based on discrete hybrid SOA-Raman amplifiers. The 8-channel CWDM spectrum (or wide-band DWDM spectrum) is carried by the fiber 710. The signal is split into two 4-channel CWDM bands (or two 70-80-nm DWDM bands) in the band demultiplexer 720, and each band is separately amplified by discrete hybrid SOA-Raman amplifiers $B_1$ (element 730) and $B_2$ (element 740). The bands are then multiplexed back onto the transmission fiber 760 with a band multiplexer 750.

Each amplifier ($B_1$ and $B_2$) of the two-band amplifier 700 is essentially a separate amplifier according to one of the two amplifier designs shown in FIG. 3 and FIG. 4. As stated previously, the choice of SOA-first or Raman-first depends on the performance of the available constituent devices and subsystems. Also, the Raman pump wavelengths and SOA gain peaks are optimized for best performance within the desired optical bandwidth.

In the example shown in FIG. 7, the demultiplexer 720 splits the optical signal into two bands, each containing four adjacent wavelength channels. Amplifier $B_1$ receives wavelength channels $\lambda_1$, $\lambda_2$, $\lambda_3$, $\lambda_4$, and amplifier $B_2$ receives wavelength channels $\lambda_5$, $\lambda_6$, $\lambda_7$, $\lambda_8$.

For example, a two-band amplifier covering the eight-channel CWDM band from 1470 nm to 1610 nm (i.e., channels centered at 1470 nm, 1490 nm, 1510 nm, 1530 nm, 1550 nm, 1570 nm, 1590 nm, and 1610 nm) would include a band demultiplexer/multiplexer pair that divided the eight-channel band into two bands from roughly 1460-1540 nm for the short-wavelength band and 1540-1620 nm for the long-wavelength band. In the example, discrete hybrid amplifiers for each band might have the following characteristics. Amplifier $B_1$ includes a Raman pump laser at approximately 1435-nm wavelength, an SOA with gain peak at approximately 1450-nm wavelength and a pump coupler with the proper wavelength response for adding the pump wavelength onto the HNLF. Amplifier $B_2$ includes a Raman pump laser at approximately 1515-nm wavelength, an SOA with gain peak at approximately 1540-nm wavelength and a pump coupler with the proper wavelength response for adding the pump wavelength onto the HNLF. Also, the length and type of HNLF may be optimized for each band.

The inventors expect a properly designed amplifier such as that described above to have gain exceeding 12 dB over the two bands. The preliminary data shown in FIG. 6 is limited by the gain of the SOA and the excess loss of an experimental HNLF. SOAs are available with at least 5 dB higher gain, and HNLFs have been demonstrated with several dB lower loss. That would imply that gains of approximately 20 dB may be possible.

Figure 8:
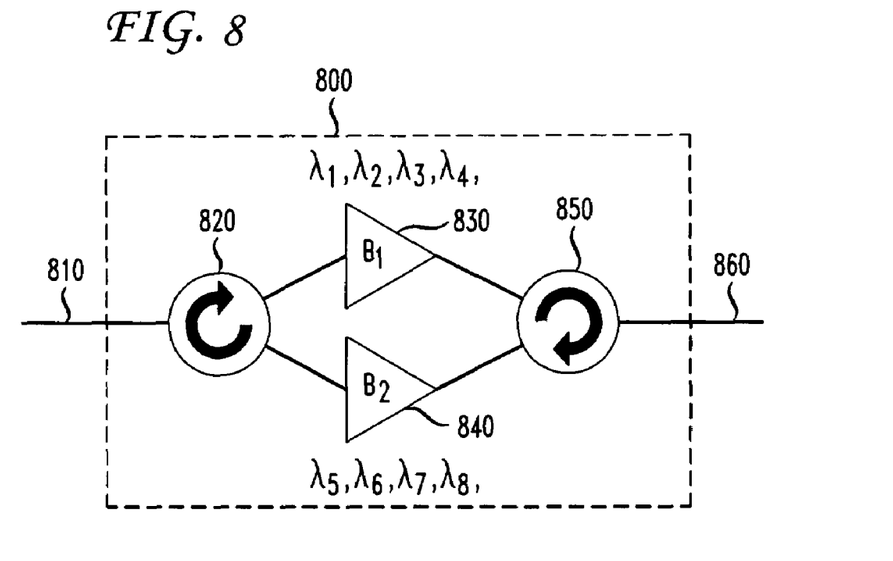
FIG. 8 is a schematic representation of a bidirectional two-band discrete hybrid SOA-Raman amplifier according to one embodiment of the invention.

The 2-band amplifier 800 of FIG. 8 is used for bidirectional transmission on a single fiber 810, 860. In that case, discrete hybrid amplifier $B_1$ (element 830) amplifies downstream (east-bound) wavelengths traveling from fiber section 810 to fiber section 860, while discrete hybrid amplifier $B_2$ (element 840) amplifies upstream (west-bound) wavelengths traveling in a separate band from fiber section 860 to fiber section 810. As with the previously described embodiment, the optical bands are split and recombined with conventional optical band multiplexers (not shown), or optical circulators 820, 850 may be used.

That implementation improves the performance of bidirectional transmission in optical systems when the downstream and upstream (east-bound and west-bound) wavelengths are distinct. In that case, reflected light from the downstream channel can easily be segregated from the upstream data-bearing wavelengths with the use of wavelength-dependant filtering. In the absence of such filtering, reflected downstream light may cause errors at the upstream receiver (and vice versa).

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. For example, although the present disclosure has concentrated on a two-band design, which is compatible with today's commercial eight-channel CWDM systems, the invention may also be used in the case of three or more optical bands. In that case, the total amplified optical bandwidth could significantly exceed 160 nm. For example, a three-band system might have a usable optical bandwidth of 240 nm; a four-band system might have a usable optical bandwidth of approximately 320 nm, etc. It is to be understood that the embodiments shown and described herein are only illustrative of the principles of the present invention and that various modifications may be implemented by those skilled in the art without departing from the scope and spirit of the invention.

What is claimed is:

1. An amplifier system for amplifying a data-bearing optical signal, comprising:
   a signal separator for separating the data-bearing optical signal into a plurality of wavelength bands, the separator having an input for receiving the data-bearing signal and a plurality of separator outputs, each for transmitting one of the wavelength bands;
   a plurality of discrete, hybrid optical amplifiers, the amplifiers being connected in one-to-one correspondence to the separator outputs, each amplifier comprising:
      a discrete Raman amplifier including an optical highly non-linear fiber (HNLF) and a backward-propagating Raman pump laser; and
      a semiconductor optical amplifier (SOA), the SOA and discrete Raman amplifier cascaded; and
      an overall gain determined by an SOA gain and a Raman amplifier gain sum wherein the SOA gain provides the majority of the overall gain and the Raman amplifier gain compensates for SOA gain tilt; and
      a gain configuration wherein the overall gain is matched to a predetermined optical bandwidth and the gains of the SOA and Raman amplifier are optimized to provide a compensated SOA gain tilt having a nearly flat response over the predetermined optical bandwidth; and
   a signal recombiner for recombining amplified wavelength bands from the discrete, hybrid optical amplifiers to form an amplified data-bearing signal, the signal recombiner having an output for transmitting the amplified data-bearing signal.

2. The system of claim 1, wherein the data-bearing optical signal comprises eight coarse wavelength division multiplexed (CWDM) channels, and the plurality of wavelength bands includes two bands of four CWDM channels each.

3. The system of claim 1, wherein the signal separator is an optical band demultiplexer and the signal recombiner is an optical band multiplexer.

4. The system of claim 1, wherein the Raman pump laser in each discrete, hybrid optical amplifier has a pumping wavelength below the wavelength band of the connected separator output.

5. The system of claim 1, wherein the gain of the discrete Raman amplifier of each discrete, hybrid optical amplifier increases within the wavelength band of the connected separator output, and the gain of the SOA in that amplifier decreases within that wavelength band.

6. The system of claim 5, wherein the overall gain in each discrete, hybrid optical amplifier is more constant over the wavelength range than the individual gains.

7. The system of claim 1, wherein the HNLF is less than 5 kilometers in length.

8. The system of claim 1, wherein the HNLF is 3 kilometers or less in length.

9. The system of claim 1, wherein each discrete, hybrid optical amplifier further comprises:
   an optical isolator coupled to an output of the SOA.

10. A method for amplifying a data-bearing optical signal, the method comprising:

separating the optical signal into a plurality of wavelength band signals, each wavelength band signals being within a different wavelength band;

transmitting each wavelength band signal in a forward direction through a separate optical highly non-linear fiber (HNLF);

introducing a separate backward-propagating Raman pumping signal into each separate HNLF to amplify the wavelength band signal;

further amplifying each wavelength band signal using a separate semiconductor optical amplifier (SOA) for each wavelength band signal;

determining an overall gain determined by an SOA gain and a Raman pumping signal gain sum wherein the SOA gain provides the majority of the overall gain and the Raman pumping signal gain compensates for SOA gain tilt;

matching the overall gain to a predetermined optical bandwidth and optimizing the gains of the SOA and Raman Pumping signal to provide a compensated SOA gain tilt having a nearly flat response over the predetermined optical bandwidth; and recombining the plurality of wavelength band signals after amplification by the SOA and Raman pumping signal to form a recombined amplified data-bearing optical signal.

11. The method of claim 10, wherein the step of introducing a separate backward-propagating Raman pumping signal into each separate HNLF further comprises introducing a Raman pumping signal having a pumping wavelength below the wavelength band of the signal transmitted through that HNLF.

12. The method of claim 10, wherein the gain of the Raman pumping signal increases within the wavelength band of the corresponding transmitted signal, and the gain of the SOA decreases within that wavelength band.

13. The method of claim 12, wherein the overall gain is more constant over a corresponding wavelength band than the individual gains.

14. The method of claim 12, wherein the overall gain has a broader bandwidth than the individual gains.

15. The method of claim 10, further comprising the step of:
transmitting an output of each SOA through a separate optical isolator.

16. The method of claim 10, wherein the step of separating the optical signal into a plurality of wavelength band signals, each wavelength band signals within a different wavelength band, further comprises separating an optical signal containing eight CWDM channels into two wavelength band signals each containing four CWDM channels.

17. A hybrid optical amplifier for amplifying an optical signal within a wavelength range that includes at least one optical wavelength signal channel comprising:

a cascaded amplifier topology comprising:
a discrete Raman amplifier including an optical highly non-linear fiber (HNLF) and a backward-propagating Raman pump laser; and
a semiconductor optical amplifier (SOA); and
an overall gain determined by an SOA gain and a Raman amplifier gain sum wherein the SOA gain provides the majority of the overall gain and the Raman amplifier gain compensates for SOA gain tilt; and
a gain configuration wherein the overall gain is matched to a predetermined optical Bandwidth of about a 80 nm and the gains of the SOA and Raman amplifier are optimized to provide a compensated SOA gain tilt having a nearly flat response over the predetermined Optical bandwidth.

18. The amplifier according to claim 17 wherein the hybrid optical amplifier operational bandwidth is wider than the SOA and Raman amplifier individual bandwidths.

* * * * *